United States Patent
Utsunomiya et al.

(10) Patent No.: US 7,408,002 B2
(45) Date of Patent: Aug. 5, 2008

(54) PHOTOSENSITIVE RESIN COMPOSITION AND PROCESS FOR THE FORMATION OF HYDROGEL

(75) Inventors: Shin Utsunomiya, Miyako (JP); Seigo Yamada, Ichikawa (JP); Masahiro Takano, Inba-gun (JP); Mitsuharu Miyazaki, Inba-gun (JP)

(73) Assignee: Toyo Gosei Co., Ltd, Ichikawa-Shi, Chiba (JP)

( * ) Notice: Subject to any disclaimer, the term of this patent is extended or adjusted under 35 U.S.C. 154(b) by 356 days.

(21) Appl. No.: 10/535,045

(22) PCT Filed: Nov. 13, 2003

(86) PCT No.: PCT/JP03/14466

§ 371 (c)(1),
(2), (4) Date: May 13, 2005

(87) PCT Pub. No.: WO2004/044024

PCT Pub. Date: May 27, 2004

(65) Prior Publication Data

US 2006/0041052 A1     Feb. 23, 2006

(30) Foreign Application Priority Data

Nov. 14, 2002   (JP) .............................. 2002-331269

(51) Int. Cl.
   *C08F 299/04*    (2006.01)
   *C08L 31/00*    (2006.01)
   *C08D 5/02*    (2006.01)

(52) U.S. Cl. .................. 524/556; 430/270.1; 430/286.1; 430/287.1

(58) Field of Classification Search ............... 524/556; 430/286.1, 287.1, 270.1
See application file for complete search history.

(56) References Cited

U.S. PATENT DOCUMENTS

| | | | | |
|---|---|---|---|---|
| 5,102,775 | A | * | 4/1992 | Okuhara et al. .......... 430/287.1 |
| 5,399,604 | A | * | 3/1995 | Sano et al. ................ 524/356 |
| 5,723,261 | A | | 3/1998 | Yanagawa et al. |
| 5,741,622 | A | * | 4/1998 | Arima ..................... 430/270.1 |

FOREIGN PATENT DOCUMENTS

| | | | |
|---|---|---|---|
| JP | 49-098878 | | 9/1974 |
| JP | 58 079006 A | | 5/1983 |
| JP | 63-075552 | | 5/1988 |
| JP | 02-240555 | | 9/1990 |
| JP | 02-308805 | | 12/1990 |
| JP | 04-337087 | | 11/1992 |
| JP | 05-320612 | | 12/1993 |
| JP | 10-003167 | | 1/1998 |
| JP | 11-327139 | * | 11/1999 |
| JP | 11327139 A | * | 11/1999 |
| JP | 2001-058972 | | 3/2001 |
| JP | 2002 182391 A | | 6/2002 |
| JP | 2002-214354 | | 7/2002 |
| WO | WO 98/00759 A | | 1/1998 |

OTHER PUBLICATIONS

Supplementary European Search Report for European Application No. EP03772744 (foreign counterpart application) dated Jan. 16, 2007.

* cited by examiner

*Primary Examiner*—Randy Gulakowski
*Assistant Examiner*—Michael M Bernshteyn
(74) *Attorney, Agent, or Firm*—Gomez International Patent Office, LLC

(57) ABSTRACT

The photosensitive resin composition is composed of a poly((meth)acrylic acid)-based water-soluble photo-sensitive resin (A) having an acid value of 150 mgKOH/g or more on a solid basis; the resin (A) being formed of a ((meth)acrylic acid)-based polymer in which a compound represented by formula (1):

$$H_2C=C(R^1)-C(=O)-O-R^2-O-CH_2-CH(OH)-CH_2-O \quad (1)$$

(wherein $R^1$ represents H or Me; and $R^2$ represents a liner or branched C2-C10 alkylene group) has been added to portions of the carboxylic groups, a photopolymerization initiator (B); and water (C).

4 Claims, No Drawings

PHOTOSENSITIVE RESIN COMPOSITION AND PROCESS FOR THE FORMATION OF HYDROGEL

BACKGROUND OF THE INVENTION

1. Technical Field

The present invention relates to a photopolymerizable photosensitive resin composition and to a method for forming a hydrogel from the composition.

2. Background Art

Poly((meth)acrylic acid) and an alkali-neutralized product thereof are highly miscible with hydrophilic physiologically active substances such as drug ingredients and enzymes. Thus, for the purpose of retaining and immobilizing hydrophilic substances, such polymers are employed in wastewater treatment and as a base material for a diagnostic drug, a cataplasm, etc. In most cases, such a base material is hardened under hydrous conditions through cross-linking so as to retain and immobilize a substance of interest. The thus-hardened product is generally called "hydrogel." Water plays important roles in hydrogel, including dissolving a substance in a film-form substrate, controlling rate of releasing a substance to the outside, and controlling rate of mass diffusion from the outside.

Conventionally, hydrogel of poly((meth)acrylic acid) or an alkali-neutralized product thereof is formed through hardening by heat. When a substance having poor thermal stability or a volatile substance is immobilized in gel, the polymer must be hardened at low temperature. Thus, completion of gel formation and immobilization requires a very long period of time (e.g., several days), which is problematic (Japanese Patent Application Laid-Open (kokai) No. 5-320612).

In recent years, a non-thermal method, employing a photocurable resin, for immobilizing a thermally instable physiologically active substance such as an enzyme or bacterial cells has become known as an advantageous method in the art, as discussed in Japanese Patent Publication (kokoku) No. 8-23545, and Japanese Patent Application Laid-Open (kokai) Nos. 2-240555 and 2-308805.

Among photosensitive resins disclosed in the above documents, so-called PVA-SbQ resin has drawbacks. Specifically, since PVA-SbQ resin has a cationic moiety in the molecule, only limited compounds may be dissolvable or miscible in immobilization of a physiologically active substance, an enzyme, or bacterial cells. In addition, in the presence of a large amount of water, photosensitivity of PVA-SbQ resin decreases considerably. Thus, when a compound that cannot be subjected to a drying step is immobilized under hydrous conditions, the formed gel has poor strength, due to insufficient hardenability.

Another photopolymerizable composition, which is a composition containing a cellulose-based polymer, has poor photosensitivity. When such a composition is used, an additional polymerizable monomer is required to be incorporated into the composition so as to attain sufficient hardenability. However, complete polymerization of the polymerizable monomer through photocuring reaction is virtually impossible, and the remaining unreacted monomer problematically inhibits enzymatic activity or causes skin irritation. Thus, the cellulose-based polymer composition is difficult to employ for immobilizing enzymes or producing a cataplasm.

Conventionally, there is a known technique for introducing a polymerizable cross-linking moiety into poly((meth)acrylic acid) by use of a (meth)acrylate ester having an epoxy group. This is described in Japanese Patent Application Laid-Open (kokai) No. 49-98878. However, the document does not disclose a photocurable and water-containing composition, and the disclosed approach polymer cannot be employed for the formation of a hydrogel, which is an object attained by the present invention.

Similarly, there techniques have previously been reported for introducing a cross-linking group into a poly((meth) acrylic acid) copolymer by use of a (meth)acrylate ester having an epoxy group. These are described in Japanese Patent Application Laid-Open (kokai) Nos. 10-3167 and 4-337087. Although the above copolymers are photocurable, the copolymers are provided for use in photoresist and have a pH-dependent water-solubility; i.e., have poor solubility in water under weak acidic to neutral conditions. Thus, the copolymers exhibit insufficient physical properties, including miscibility with other compounds and water content of gel during the formation of a hydrogel, which is an object attained by the present invention.

As described above, poly((meth)acrylic acid) is a key compound for formation of hydrogel for use in a cataplasm, a diagnostic drug, or wastewater treatment, and photocuring is an effective technique for forming a hydrogel for the above uses. However, a useful technique has previously not been developed employing poly((meth)acrylic acid) and photocuring in combination.

SUMMARY OF THE INVENTION

The instant invention provides a photosensitive resin composition formed from poly((meth)acrylic acid), which composition exhibits excellent storage stability, affinity, miscibility, or solubility with respect to a variety of compounds, and high sensitivity, and allows these compounds to be photoimmobilized even under hydrous conditions. Another object of the invention is to provide a method for forming a hydrogel from the composition.

In recent years, there have been reported cross-linkable polymers and oligomers which have been synthesized from an acrylate ester having an epoxy group and into which an alkylene group serving as a spacer has been introduced between an epoxy group and an acryl group (Japanese Patent Application Laid-Open (kokai) Nos. 11-327139 and 2001-58972). In these polymers and oligomers, due to the spacer effect of the alkylene group, a (meth)acryl group comes to have a higher degree of freedom. Thus, the polymers and oligomers are excellent materials in terms of enhanced rate of reaction, improved physical properties of cured products (e.g., toughness of cured products) and advantageous safety (e.g., reduced toxicity and irritation). However, these documents disclose neither a water-soluble composition nor a water-containing composition, and disclose that the polymers and oligomers are not water-soluble. According to the above reported polymers and oligomers, formation of a hydrogel which is to be attained by the present inventors cannot be attained.

The present invention is based on the discovery that, through use of a poly((meth)acrylic acid)-based water-soluble photo-sensitive resin formed of a ((meth)acrylic acid)-based polymer in which a compound represented by formula (1) has been added to portions of the carboxylic groups, a photosensitive resin composition can be produced which exhibits excellent storage stability, affinity, miscibility, or solubility with respect to a variety of compounds, as well as high sensitivity, and allows these compounds to be photo-immobilized even under hydrous conditions. The present inventors have also found that a method for forming a hydrogel can be realized by use of the composition.

As used herein, the term "(meth)acrylic acid" refers to "acrylic acid" or "methacrylic acid."

Specifically, the present invention provides a photosensitive resin composition comprising a poly((meth)acrylic acid)-based-water-soluble photosensitive resin (A) having an acid value of 150 mgKOH/g or more on a solid basis;

the resin (A) being formed of a ((meth)acrylic acid)-based polymer in which a compound represented by formula (1):

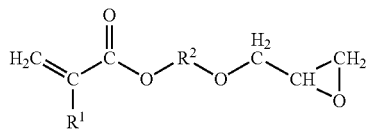

(wherein $R^1$ represents H or Me; and $R^2$ represents a linear or branched C2-C10 alkylene group) which has been added to portions of the carboxylic groups;

a photopolymerization initiator (B); and water (C).

In a preferred mode of the present invention the carboxyl groups of the ((meth)acrylic acid)-based polymer to which the compound represented by formula (1) has not been added are at least partially neutralized with an alkali.

Still another mode of the present invention provides a method for forming a hydrogel comprising subjecting a photosensitive resin composition of the above modes to photopolymerization.

DETAILED DESCRIPTION OF THE INVENTION

The photosensitive resin compositions of the present invention contain a poly((meth)acrylic acid)-based water-soluble photo-sensitive resin (A), a photopolymerization initiator (B), and water (C).

The photosensitive resin (A) can be produced through epoxy-ring-opening addition of a compound represented by formula (1) to portions of the carboxylic groups present in a ((meth)acrylic acid)-based polymer.

Examples of the compound represented by formula (1) include 2-hydroxyethyl acrylate glycidyl ether, 2-hydroxyethyl methacrylate glycidyl ether, 2-hydroxypropyl acrylate glycidyl ether, 2-hydroxypropyl methacrylate glycidyl ether, 4-hydroxybutyl acrylate glycidyl ether, and 4-hydroxybutyl methacrylate glycidyl ether.

The poly((meth)acrylic acid)-based polymer can be a (meth)acrylic acid homopolymer or a copolymer of two or more monomers selected from among (meth)acrylic acid monomers, vinyl monomers, and (meth)acrylate monomers. The poly((meth)acrylic acid)-based polymer can be a side-chain-modified product with a compound other than the compound represented by formula (1). In any case, the poly((meth)acrylic acid)-based polymer is selected such that the polymer to which the compound represented by formula (1) has been added has an acid value of 150 mgKOH/g or more on a solid basis, preferably at least 170 mgKOH/g.

No particular limitation is imposed on the molecular weight of the photosensitive resin (A), and the weight average molecular weight is preferably about from 5,000 to 2,000,000. When the molecular weight is less than about 5,000, hardenability may be poor, whereas when the molecular weight is in excess of about 2,000,000, viscosity of the resin excessively increases, causing difficulty in synthesis and in application of the resin composition to a substrate.

No particular limitation is imposed on the percent addition of the compound represented by formula (1), and the percent addition is determined in accordance with cross-linking density and mechanical strength of a hardened product of interest. In any case, the percent addition is controlled such that the photosensitive resin (A) after addition has an acid value of 150 mgKOH/g or more on a solid basis, preferably 170 mgKOH/g or more. When the acid value is less than 150 mgKOH/g, sufficient water solubility fails to be attained.

The addition reaction of the compound represented by formula (1) to portions of the carboxylic groups present in a ((meth)acrylic acid)-based polymer, thereby forming the photosensitive resin (A), is generally carried out in a solution with heating and/or in the presence of a catalyst. The solvent used for forming the solution can vary widely. The solvent is preferably a composition which can dissolve the poly((meth)acrylic acid)-based polymer used. Examples of solvents which can be used include water; methanol; ethanol; 2-propanol; n-butanol; sec-butanol; isobutanol; tert-butanol; ethylene glycols such as ethylene glycol, diethylene glycol, triethylene glycol, and tetraethylene glycol; glycol ethers such as ethylene glycol monomethyl ether, diethylene glycol monomethyl ether, ethylene glycol diethyl ether, and diethylene glycol dimethyl ether; glycol ether acetates such as ethylene glycol monoethyl ether acetate, diethylene glycol monoethyl ether acetate, and diethylene glycol monobutyl ether acetate; propylene glycols such as propylene glycol, dipropylene glycol, and tripropylene glycol; propylene glycol ethers such as propylene glycol monomethyl ether, propylene glycol monoethyl ether, dipropylene glycol monomethyl ether, dipropylene glycol monoethyl ether, propylene glycol dimethyl ether, dipropylene glycol dimethyl ether, propylene glycol diethyl ether, and dipropylene glycol diethyl ether; propylene glycol ether acetates such as propylene glycol monomethyl ether acetate, propylene glycol monoethyl ether acetate, dipropylene glycol monomethyl ether acetate, and dipropylene glycol monoethyl ether acetate; dimethylsulfoxide; N-methylpyrrolidone; dimethylformaide; dimethylacetamide; and mixture thereof.

The catalyst used in the reaction can also vary widely. Examples of acid catalysts which can be used include inorganic acids such as sulfuric acid, phosphoric acid, perchloric acid; Lewis acids such as $BF_3$; and organic sulfonic acids such as methanesulfonic acid, benzenesulfonic acid, p-toluenesulfonic acid, and dodecylbenzenesulfonic acid. Examples of basic catalysts which can be used include tertiary amines such as triethylamine, tetramethylethylenediamine, tributylamine, tri-n-octylamine, dimethylbenzylamine, and pyridine; quaternary ammonium salts such as tetramethylammonium chloride, tetramethylammonium bromide, tetraethylammonium bromide, and tetrabutylammonium bromide; and phosphorus compounds such as triphenylphosphine and tributylphosphine.

The reaction temperature can vary widely. Generally, the reaction is preferably performed at room temperature to 120° C.

When the photosensitive resin composition of the present invention is produced from a photosensitive resin that has been synthesized with a solvent other than water, the synthesized photosensitive resin may be simply diluted with water. Alternatively, there may be employed distil off and substitution of the solvent; drying to solid and dissolving the solid in water; or pouring the resin into a non-polar solvent such as aliphatic hydrocarbon, aromatic hydrocarbon, ethyl acetate, or butyl acetate, separating the precipitated solid, and redissolving the solid in water.

Notably, the carboxylic groups remaining in the photosensitive resin (A) can be free-acid form or alkali-neutralized form. The alkali compound used can vary widely. Examples of alkalis which can be used include inorganic alkalis such as lithium, sodium, and potassium; ammonia; primary to tertiary alkylamines; and quaternary ammonium compounds. No particular limitation is imposed on the degree of neutralization, and neutralization can be regulated so as to attain a pH suited for the purpose of use.

The solids content of the photosensitive resin composition of the present invention containing the photosensitive resin (A), a photopolymerization initiator (B), and water, can vary widely, for example, from about 3% to about 50%. When the solids content falls within the above range, a particularly strong gel can be formed.

The photosensitive resin composition of the present invention essentially contains a photopolymerization initiator and may further contain a photosensitizer. Upon incorporation of the photopolymerization initiator into the composition, the initiator can be dissolved or dispersed in the composition. Alternatively, the initiator can be chemically linked to the photosensitive resin. When the photopolymerization initiator is dissolved or dispersed in the composition, the photopolymerization initiator is generally incorporated in an amount of about from 0.1 to 30 wt. % with respect to the amount of the photosensitive resin, preferably about form 1 to 10 wt. %. No particular limitation is imposed on the photopolymerization initiator and photosensitizer used in the composition. Examples of compound which can be used include benzophenones such as benzophenone, hydroxybenzophenone, bis-N,N-dimethylaminobenzophenone, bis-N,N-diethylaminobenzophenone, and 4-methoxy-4'-dimethylaminobenzophenone; thioxanthones such as thioxanthone, 2,4-diethylthioxanthone, isopropylthioxanthone, chlorothioxanthone, and isopropoxychlorothioxanthone; anthraquinones such as ethylanthraquinone, benzanthraquinone, aminoanthraquinone, and chloroanthraquinone; acetophenones; benzoin ethers such as benzoin methyl ether, benzoin ethyl ether, and benzoin phenyl ether; 2,4,6-trihalomethyltriazines; 1-hydroxycyclohexyl phenyl ketone; 2,4,5-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, and 2-(2,4-dimethoxyphenyl)-4,5-diphenylimidazole dimer; benzyl dimethyl ketal; 2-benzyl-2-dimethylamino-1-(4-morpholinophenyl)-butan-1-one; 2-methyl-1-[4-(methylthio)phenyl]-2-morpholino-1-propanone; 2-hydroxy-2-methyl-1-phenyl-propan-1-one; 1-[4-(2-hydroxyethoxy)-phenyl]-2-hydroxy-2-methyl-1-propan-1-one; phenanthrenequinone; 9,10-phenanthrenequinone; benzoins such as methylbenzoin and ethylbenzoin; acridine derivatives such as 9-phenylacridine and 1,7-bis(9,9'-acridinyl)heptane; bisacylphosphine oxide; and mixture thereof.

In addition to the above initiators, other additives such as a promoter may also be added. Examples of promoters which can be used include ethyl p-dimethylaminobenzoate, isoamyl p-dimethylaminobenzoate, ethanolamine, diethanolamine, and triethanolamine.

To the photosensitive resin composition of the present invention, polymerizable monomer can be added in order to regulate sensitivity of the composition and physical properties of the hardened products. Examples of monomers which can be so used include polyethylene glycol diacylate (No. of ethylene oxide unit: 2 to 14), polyethylene glycol dimethacrylate (No. of ethylene oxide unit: 2 to 14), trimethylolpropane diacrylate, trimethylolpropane dimethacrylate, trimethylolpropane triacrylate, trimethylolpropane trimethacrylate, trimethylolpropane ethoxytriacrylate, trimethylolpropane ethoxytrimethacrylate, trimethylolpropane propoxytriacrylate, trimethylolpropane propoxytrimethacrylate, tetramethylolmethane triacrylate, tetramethylolmethane trimethacrylate, tetramethylolmethane tetraacrylate, tetramethylolmethane tetramethacrylate, polypropylene glycol diacrylate (No. of propylene oxide units: 2 to 14), polypropylene glycol dimethacrylate (No. of propylene oxide units: 2 to 14), dipentaerythritol pentaacrylate, dipentaerythritol pentamethacrylate, dipentaerythritol hexaacrylate, dipentaerythritol hexamethacrylate, bisphenol A polyoxyethylene diacrylate, bisphenol A polyoxyethylene dimethacrylate, bisphenol A dioxyethylene diacrylate, bisphenol A dioxyethylene dimethacrylate, bisphenol A trioxyethylene diacrylate, bisphenol A trioxyethylene dimethacrylate, bisphenol A decaoxyethylene diacrylate, bisphenol A decaoxyethylene dimethacrylate, esterified products of polyhydric carboxylic acid (e.g., phthalic anhydride) and compounds having a hydroxyl group and an ethylenic unsaturated group (e.g., β-hydroxyethyl acrylate and β-hydroxyethyl methacrylate), and acrylic acid or methacrylic acid alkyl esters (e.g., methyl acrylate, methyl methacrylate, ethyl acrylate, ethyl methacrylate, butyl acrylate, butyl methacrylate, 2-ethylhexyl acrylate, and 2-ethylhexyl methacrylate).

If required, conventionally known other components such as polymerization inhibitors, plasticizers, pigments, dyes, surfactants, defoaming agents, and coupling agents can also be incorporated into the compositions of the invention.

The photosensitive resin compositions of the present invention exhibit high sensitivity even when the composition is present in a low concentration. Thus, when a low-concentration (e.g., about 3% in solid content) aqueous solution of the composition is subjected to photopolymerization, a hydrogel can be formed.

Into the photosensitive resin compositions of the present invention, any of the functional components including a variety of drug ingredients, enzymes, bacterial cells, etc. can be incorporated. In this case, a photosensitive resin composition containing any of a variety of drug ingredients, enzymes, bacterial cells, etc. is photocured, whereby a hydrogel containing any of a variety of drug ingredients, enzymes, bacterial cells, etc. can be formed. Needless to say, after formation of a hydrogel from the photosensitive resin composition of the present invention, the hydrogel can be impregnated with any of a variety of drug ingredients, enzymes, bacterial cells, etc.

Similar to a conventional resist composition, the photosensitive resin compositions of the present invention can be patterned. Thus, a photosensitive resin composition containing any of the functional components including a variety of drug ingredients, enzymes, bacterial cells, etc. or a hydrogel formed from a photosensitive resin composition of the present invention and impregnated with any of the functional components including a variety of drug ingredients, enzymes, bacterial cells, etc. can be patterned through photolithography.

The photosensitive resin compositions of the present invention exhibit excellent storage stability and affinity, miscibility, or solubility with respect to a variety of compounds. In addition, the composition forms, at remarkably high-speed, a uniform hydrogel having high gel strength, even though the composition has a low concentration. Thus, the composition of the present invention is remarkably useful.

The present invention will next be described in detail by way of examples, which should not be construed as limiting the invention thereto. Needless to say, a variety of photosensitive resin compositions obtained from the photosensitive resin and finding various uses fall within the scope of the present invention.

EXAMPLE 1

Poly(acrylic acid) (Aqualic AS-58, product of Nippon Shokubai Co., Ltd., weight average molecular weight of 800,000) (10 g) was dissolved in methanol (75 g) with heating. 4-Hydroxybutyl acrylate glycidyl ether (4HBAGE, product of Nippon Kasei Chemical Co., Ltd.) (1.6 g) and pyridine (1.1 g) serving as a catalyst for accelerating reaction were added to the above methanol solution, and the mixture was stirred on a 55° C.-hot-water bath for 24 hours. Methanol was removed by elevating the bath temperature to 90° C. while water was added dropwise to the mixture, followed by treating with ion-exchange resin (PK-216H, product of Mitsubishi Chemical Corporation), to thereby remove pyridine, whereby an aqueous solution of photosensitive resin (A) (non-volatile solid content: 13%) was produced. The acid value of photosensitive resin (A), as determined through titration with a 0.1M aqueous NaOH, was 630 mgKOH/g on a solid basis. To the 13% aqueous solution (100 g) of photosensitive resin (A), 1-[4-(2-hydroxyethoxy)-phenyl]-2-hydroxy-2-methyl-1-propan-1-one (IRGACURE-2959, product of Ciba Specialty Chemicals K.K.) (0.1 g) serving as a photopolymerization initiator was added, to thereby produce an aqueous solution of a photosensitive resin composition of interest.

The thus-produced aqueous photosensitive resin composition solution was diluted with water, to thereby prepare samples having solid contents shown in Table 1. Each sample was placed in a test tube sealed with a stopper. The sample was irradiated with a UV ray having an illuminance of 250 mW/cm$^2$ emitted from a metal halide lamp UV radiator for four seconds. After completion of irradiation, the test tube was placed upright, and the stopper was removed. An iron ball (5.5 g) was placed on the surface of each sample, and hardenability of the samples was evaluated with comparison on the basis of the status (sinking or floating) of the iron ball.

TABLE 1

|  | Solid content | | | | | |
| --- | --- | --- | --- | --- | --- | --- |
|  | 2% | 3% | 4% | 6% | 8% | 10% |
| Iron ball | sink | float | Float | float | float | float |

EXAMPLE 2

The aqueous solution of photosensitive resin (A) synthesized in Example 1 was neutralized with sodium hydroxide, to thereby produce an aqueous solution having a non-volatile solid content of 10.4% (pH=6.0). To the solution (100 g), 1-[4-(2-hydroxyethoxy)-phenyl]-2-hydroxy-2-methyl-1-propan-1-one (IRGACURE-2959, product of Ciba Specialty Chemicals K.K.) (0.08 g) serving as a photopolymerization initiator was added, to thereby produce an aqueous solution of a photosensitive resin composition.

The thus-produced aqueous photosensitive resin composition solution was diluted with water, to thereby prepare samples having solid contents shown in Table 2. Under the same conditions as employed in Example 1, hardenability of the samples was evaluated with comparison on the basis of the status (sinking or floating) of the iron ball.

TABLE 2

|  | Solid content | | | | | |
| --- | --- | --- | --- | --- | --- | --- |
|  | 2% | 3% | 4% | 6% | 8% | 10% |
| Iron ball | sink | float | float | Float | float | float |

COMPARATIVE EXAMPLE 1

PVA-SbQ resin (SPP-H-13, product of Toyo Gosei Co., Ltd., polymerization degree of 1,700) was diluted with water, to thereby prepare samples having solid contents shown in Table 3. In a manner similar to that of Example 1, hardenability of the samples was evaluated.

TABLE 3

|  | Solid content | | | | | |
| --- | --- | --- | --- | --- | --- | --- |
|  | 2% | 3% | 4% | 6% | 8% | 10% |
| Iron ball | sink | sink | sink | Sink | float | float |

As is clear from Tables 1 to 3, low-concentration samples (solid content: 3%) of Examples 1 and 2 formed uniform hydrogels having high gel strength and were able to maintain an iron ball on the gel surface. In contrast, the samples of Comparative Example 1 were able to maintain an iron ball on the sample surface, only when the solid content of the sample increased to 8%, which is a threshold concentration higher than that determined in the Examples.

We claim:

1. A method for forming a hydrogel by subjecting a photosensitive resin composition to photopolymerization, the photosensitive resin composition comprising
    a poly((meth)acrylic acid)-based water-soluble photo-sensitive resin (A) having an acid value of 170 mgKOH/g or more on a solid basis;
    the resin (A) being formed of a ((meth)acrylic acid)-based polymer in which a compound represented by formula (1):

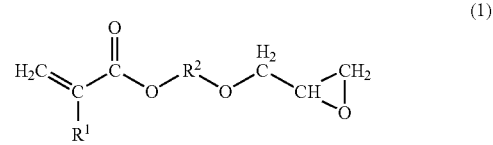

(1)

wherein R$^1$ represents H or Me; and R$^2$ represents a linear or branched C$_2$-C$_{10}$ alkylene group, has been added to portions of carboxyl groups of (meth)acrylic acid composing the ((meth)acrylic acid)-based polymer,
    a photopolymerization initiator (B); and
    water (C).

2. A method for forming a hydrogel according to claim 1, wherein the carboxyl groups of the ((meth)acrylic acid)-based polymer to which the compound represented by formula (1) has not been added are at least partially neutralized with an alkali.

3. A hydrogel produced by subjecting a photosensitive resin composition to photopolymerization, the photosensitive resin composition comprising a poly((meth)acrylic acid)-based water-soluble photo-sensitive resin (A) having an acid value of at least about 170 mgKOH/g on a solid basis;

the resin (A) being formed of a ((meth)acrylic acid)-based polymer in which a compound represented by formula (1):

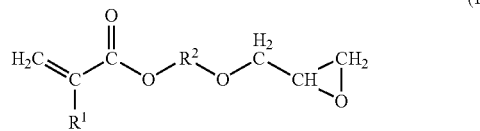

(1)

wherein $R^1$ represents H or Me; and $R^2$ represents a linear or branched C2-C10 alkylene group, has been added to portions of carboxyl groups of (meth)acrylic acid composing the ((meth)acrylic acid)-based polymer, a photopolymerization initiator (B); and water (C).

4. A hydrogel according to claim 3, wherein the carboxyl groups of the ((meth)acrylic acid)-based polymer to which the compound represented by formula (1) has not been added are at least partially neutralized with alkali.

* * * * *